United States Patent [19]

Hamashima et al.

[11] Patent Number: 6,011,262

[45] Date of Patent: Jan. 4, 2000

[54] OBJECT OBSERVING APPARATUS AND METHOD FOR ADJUSTING THE SAME

[75] Inventors: Muneki Hamashima, Chiba; Hidekazu Takekoshi, Kanagawa, both of Japan

[73] Assignee: Nikon Corporation, Tokyo, Japan

[21] Appl. No.: 09/047,454

[22] Filed: Mar. 25, 1998

[30] Foreign Application Priority Data

Mar. 26, 1997 [JP] Japan .................................. 9-091421
Mar. 26, 1997 [JP] Japan .................................. 9-091422

[51] Int. Cl.[7] .................................................. H01J 37/26
[52] U.S. Cl. ........................................... 250/310; 250/397
[58] Field of Search .................................. 250/310, 397

[56] References Cited

U.S. PATENT DOCUMENTS

| | | | |
|---|---|---|---|
| 4,978,855 | 12/1990 | Liebl et al. .............................. | 250/310 |
| 5,498,874 | 3/1996 | Miyoshi et al. ......................... | 250/397 |
| 5,895,916 | 4/1999 | Tsukajima et al. ..................... | 250/310 |

FOREIGN PATENT DOCUMENTS 4-242060  8/1992  Japan .
5-109381  4/1993  Japan .

OTHER PUBLICATIONS

Tsuno, "Simulation of a Wien filter as beam separator in a low energy electron microscope" *Ultramicroscopy* 55:127–140 (1994).

*Primary Examiner*—Jack I. Berman
*Attorney, Agent, or Firm*—Foley & Lardner

[57] ABSTRACT

The present invention discloses an object observing apparatus comprising a stage for mounting a sample to be observed; a primary optical system, having an electron gun, for emitting a primary irradiation beam to the stage; and a secondary optical system, having an inlet facing the stage, for receiving an electron generated when the sample is irradiated with the primary irradiation beam and forming an image thereof; wherein the secondary optical system comprises an imaging optical system for forming an image of the electron incident thereon, and a field aperture having a plurality of optical patterns and being adapted to selectively attach and detach each optical pattern at a predetermined position or an aperture stop having at least one aperture size and being selectively attachable and detachable.

9 Claims, 6 Drawing Sheets

Fig.1B Fig.1C Fig.1D

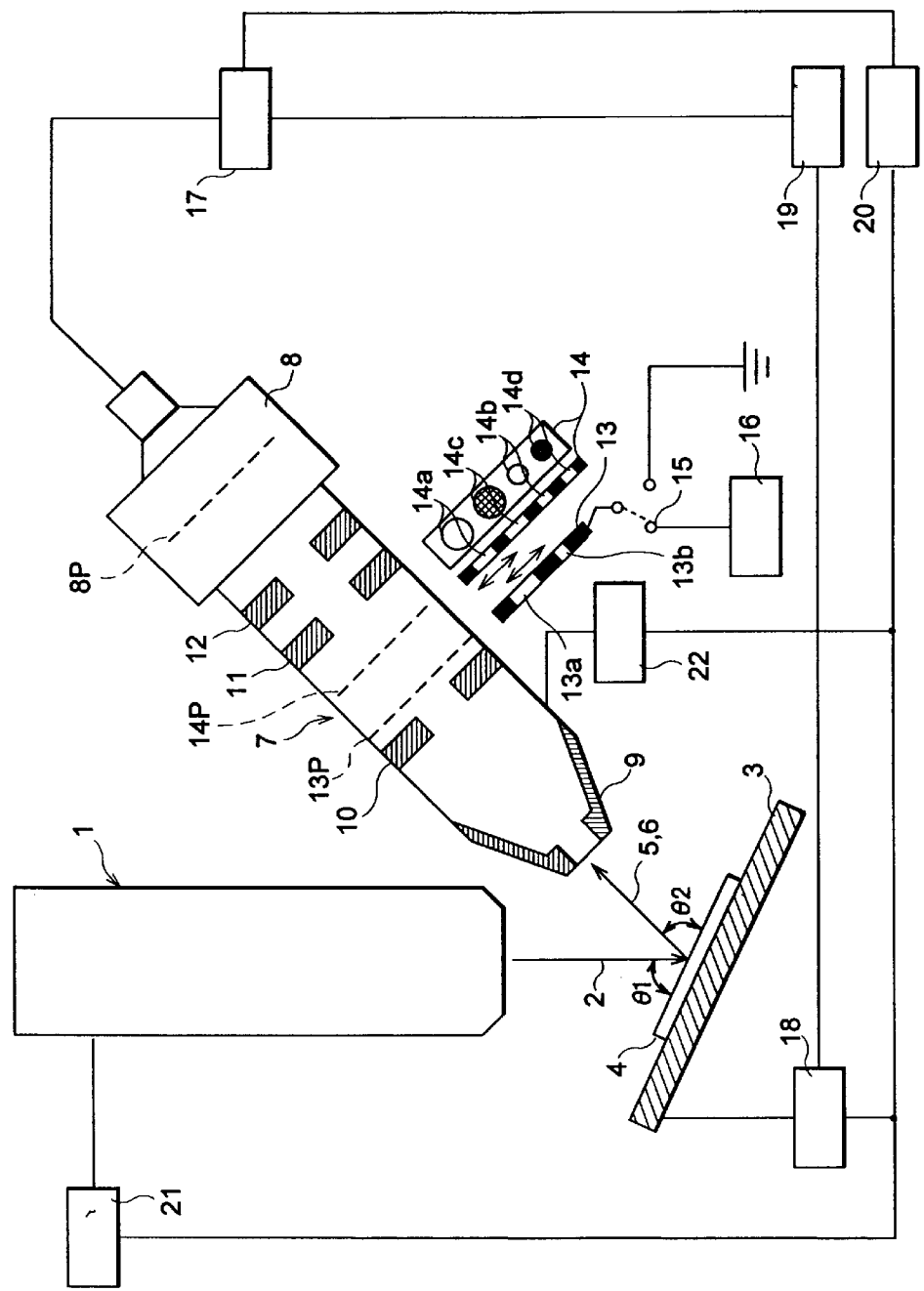

OBJECT OBSERVING APPARATUS AND METHOD FOR ADJUSTING THE SAME

BACKGROUND OF THE INVENTION

1. Field of the Invention

The present invention relates to an inspecting apparatus for irradiating a sample with a primary irradiation beam and detecting an electron image formed by electrons which constitute an energy beam from the sample, and a method of adjusting this apparatus.

2. Related Background Art

Known as an apparatus for scanning an electron beam on an object and observing secondary electrons from the object is scanning electron microscope (SEM). On the other hand, an inspecting apparatus for inspecting defects by using an electron-optical system as its primary optical system is disclosed in U.S. Pat. No. 5,498,874.

SUMMARY OF THE INVENTION

In the conventional techniques, it has been difficult to form and observe a secondary electron image of an object with a high accuracy.

It is thus an object of the present invention to provide an object observing apparatus which can correctly form a secondary electron image of an object with a high accuracy and allow samples to be observed in a fashion conforming to their characteristics; and a method of adjusting this apparatus.

It is a further object of the present invention to provide an object observing apparatus comprising a stage for mounting a sample to be observed; a primary optical system, having an electron gun, for emitting a primary irradiation beam to the stage; and a secondary optical system, having an inlet facing the stage, for receiving an electron generated when the sample is irradiated with the primary irradiation beam and forming an image thereof; wherein the secondary optical system comprises an imaging optical system for forming an image of the electron incident thereon, and a field aperture having at least one optical pattern and being adapted to selectively attach and detach each optical pattern at a predetermined position or an aperture stop having at least one aperture size and being selectively attachable and detachable.

It is a still further object of the present invention to provide a method of adjusting a lens system of the above-mentioned object observing apparatus, the method including a step of mounting a sample on the stage; a step of irradiating the sample with a primary irradiation beam emitted from the primary optical system; a step of inserting a field aperture with a first pattern at a position optically conjugate with the sample within the secondary optical system; and a step of inspecting an imaging state of an image of the first pattern in a given state of a lens within the secondary optical system and detecting a state of a lens disposed optically behind the conjugate position.

BRIEF DESCRIPTION OF THE DRAWINGS

FIGS. 1B to 1D are views respectively showing patterns formed in the field aperture of the first embodiment;

FIG. 3 is a schematic view of the object observing apparatus in accordance with the second embodiment of the present invention;

DETAILED DESCRIPTION OF THE PREFERRED EMBODIMENTS

In the following, the first embodiment of the present invention will be explained with reference to FIGS. 1A to 2D.

Figure 1A:
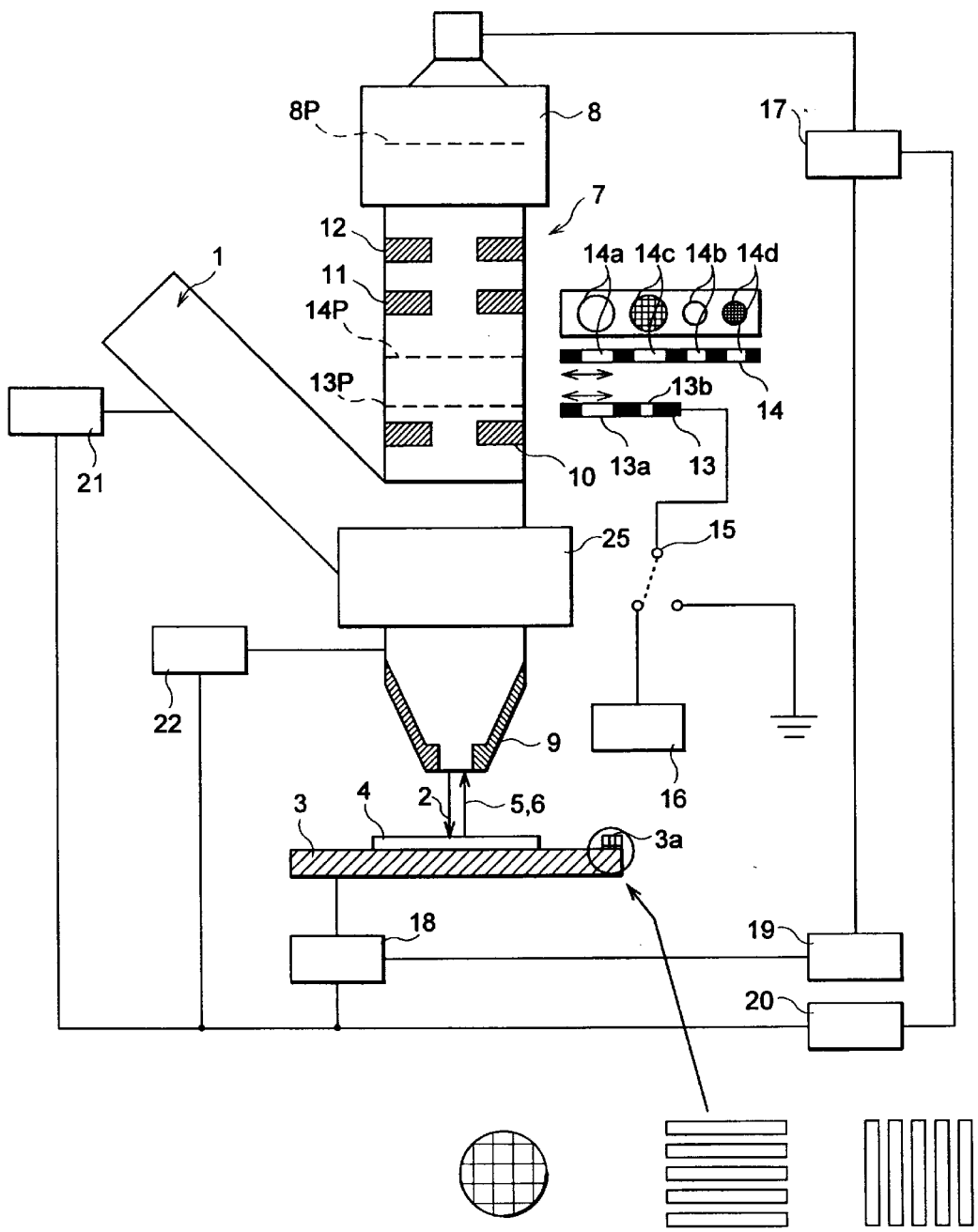
FIG. 1A is a schematic view of the object observing apparatus in accordance with the first embodiment of the present invention.
Figure 2A:
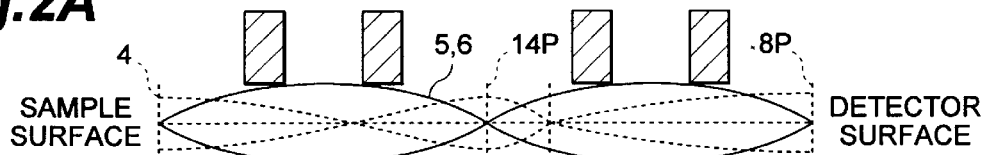
FIGS. 2A to 2D are explanatory views respectively showing imaging states in the secondary optical system in accordance with the first embodiment.
Figure 2B:
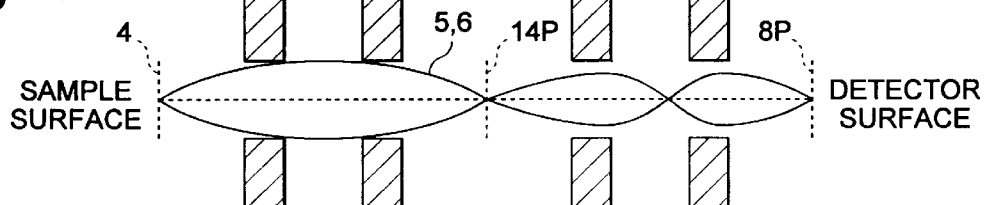
Figure 2C:
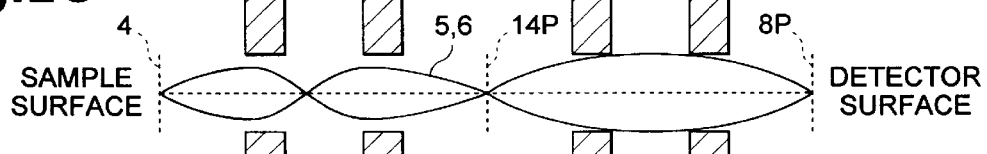
Figure 2D:
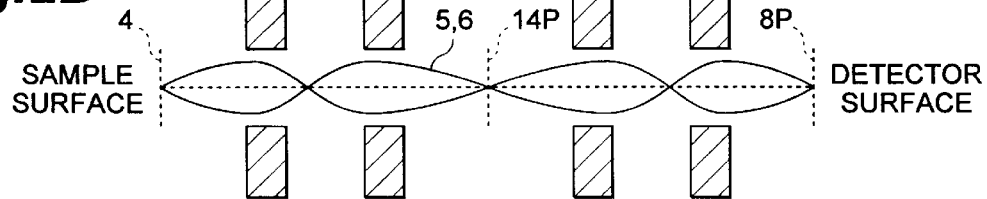

As shown in FIG. 1A, the object observing apparatus in accordance with the first embodiment comprises a stage 3 for mounting a sample 4; a primary column 1 for irradiating the sample 4 with a primary irradiation beam 2; a secondary optical system 7 for forming and observing an image of secondary electrons generated by the sample 4 irradiated with the primary irradiation beam 2; and a Wien filter 25, connecting the primary column 1 and the secondary optical system 7 to each other, for enabling the primary irradiation beam 2 to vertically irradiate the sample and allowing the secondary electron image emitted from the sample 4 along this vertical direction to be taken into the secondary optical system 7.

The primary column 1 having an electron gun and the primary optical system is configured such that the primary irradiation beam 2 emitted from the electron gun irradiates, by way of the primary optical system, the sample 4 mounted on the stage 3. This stage 3 is provided with a fiducial mark 3a as "first pattern" in a mesh form shown in FIG. 1B, a horizontal stripe form shown in FIG. 1C, or a vertical stripe form shown in FIG. 1D, which is similar to the pattern formed in a field aperture explained later.

Upon this irradiation, secondary electrons 5 and reflected electrons 6 are generated from the sample 4. The secondary electrons 5 and reflected electrons 6 including two-dimensional information generated on the surface of the sample 4 are captured by the secondary optical system 7 and then are projected onto the detection surface 8P of a detector 8 as being magnified.

Specifically, in the first place from the lower side, the secondary optical system 7 comprises a cathode lens 9. This cathode lens 9 is constituted by three sheets of electrodes, in which the lowermost electrode is designed such that a positive electric field is formed between this electrode and the potential on the sample 4 side, so as to efficiently lead the secondary electrons 5 into the lens 9. Also, a lens action is effected when a voltage is applied to the first and second electrodes while the third electrode is set to zero potential. The lowermost electrode functions as "cathode portion."

Since sufficient magnification cannot be obtained by the cathode lens 9 alone, second, third, and fourth lenses 10, 11, and 12 are disposed as a lens system for magnification, thereby yielding a multistage lens configuration. Each of the second, third, and forth lenses 10, 11, and 12 has a configuration made of three sheets of electrodes, which is known as unipotential or einzel lens. Usually, the outer two electrodes are set to zero potential, whereas the lens action is effected and controlled by a voltage applied to the center electrode.

When imaging is effected by the cathode lens 9 alone, the lens action may become so strong that aberration is likely to occur. Accordingly, there are cases where a single imaging operation is effected in cooperation with the second lens 10. Similarly, there are cases where it is better for the magnifying lens system to have the third and fourth lenses 11 and 12 so as to effect the second imaging operation in cooperation therewith. As a consequence, in this case, a configuration constituted by a group of four sheets of lenses 9, 10, 11, and 12 is necessary. When lens voltages of these lenses 9, . . . are appropriately set, imaging patterns such as those shown in FIGS. 2A, 2B, 2C, and 2D can be obtained.

Disposed between the second lens 10 and the third lens 11, on the rear side of the second lens 10, is an aperture stop 13. This aperture stop 13 is located near a pupil position 13P of the secondary optical system or lens system. This pupil position is not only the position where the electrons emitted from the sample in parallel to the optical axis are converged by the lens system but also the principal ray from the sample, for example, becomes telecentric (e.g., see FIG. 2A). The aperture stop 13, which is a thin film made of a metal (Mo or the like) having a circular hole, functions to suppress various kinds of aberration of the individual lenses 10, 11, and 12, determine the angle of divergence of electron beam on the sample surface, and prevent scattered electrons from reaching the upper portion. Further, the aperture stop 13 is electrically insulated from the lens electrodes and is connected to an ammeter 16 by way of a switch 15. When adjusting the optical system, the amount of current in the beam can be monitored by the ammeter 16.

In the secondary optical system 7, some imaging points caused by the individual lenses 9, 10, and the like exist within its column. As explained above, since sufficient magnification is not obtained by a single imaging operation alone, a magnification is determined under at least two imaging conditions, and a lens voltage conforming to this magnification is set. An even number of imaging operations would yield an erect image. Here, a field aperture 14 corresponding to an aperture stop, adapted to be inserted into and retracted from the front side of the third lens 11, is disposed at the intermediate imaging position 14P (position optically conjugate with the sample). As a consequence, only the secondary electrons 5 within a required field of view are lead to the later stage of lens system (third and fourth lenses 11 and 12) and the detectors (image detecting surface 8P). The field aperture 14 is formed with field holes 14a and 14b having sizes different from each other, and two mesh portions 14c and 14d as "second pattern" respectively having sizes corresponding to those of the field holes 14a and 14b. Though the mesh portions 14c and 14d such as the one shown in FIG. 1B are employed in the first embodiment, without being restricted thereto, patterns shown in FIGS. 1C and 1D may be used as well.

Further, the detector 8 is controlled by a control unit 17 so as to take out a sample image signal. The stage 3 is movable in XY directions by a stage moving mechanism 18, whose position can be read out by a laser interferometer unit 19. According to an instruction from a CPU 20, the stage moving mechanism 18 is driven, and its positional information is transmitted from the laser interferometer unit 19 to the control unit 17, whereby sample images are successively supplied to the CPU 20. On the other hand, the CPU 20 is connected to a primary optical system control unit 21 for controlling the primary column 1 and a secondary optical system control unit 22 for controlling the secondary optical system 7.

Further, in the first embodiment, as shown in FIG. 1A, the primary column 1 is connected between the cathode lens 9 and second lens 10 of the secondary optical system 7, while the above-mentioned Wien filter 25 is disposed between the primary column 1 and the cathode lens 9 and between the second lens 10 and the cathode lens 9.

This Wien filter 25 functions as an electromagnetic prism. The primary irradiation beam 2 having a specific energy emitted from the primary column 1 is bent by the Wien filter 25 by an angle determined by its acceleration voltage so as to be vertically incident on the surface of the sample 4. At the time of incidence, the primary irradiation beam 2 is decelerated by the cathode portion of the cathode lens 9 before irradiating the sample 4. As the primary and secondary optical systems 1 and 7 are disposed as mentioned above, the secondary electrons 5 and reflected electrons 6 are led to the secondary optical system 7. On the other hand, the Wien filter 25, which functions as a filter for sorting the electrons 5 and 6 from the sample 4, can transmit therethrough the secondary electrons 5 or reflected electrons 6 having a specific energy from the sample 4, so as to lead thus transmitted electrons toward the secondary lens 10.

Here, how to select the secondary electrons 5 or reflected electrons 6 in practice will be explained. In general, respective images of the secondary electron and reflected electron totally differ from each other; the former mostly reflecting surface forms, whereas the latter mostly inspecting changes in compositions as a contrast. Whether the former or latter is preferable depends on the kind (wafer pattern/substrate) of sample. Also, they often differ from each other in terms of influences of charging up and contrast and in terms of S/N ratio. Therefore, the present invention, which can detect both of them by the same detector by simply changing lens conditions, is quite effective in adapting to different samples. Also, the S/N of thus obtained image is in proportion to the number of electrons at the surface of the detector 8, whereby chromatic aberration, which is heavily influential in the image, depends on fluctuations in electronic energy. Accordingly, when priority is to be assigned to image resolution that depends on chromatic aberration, of the secondary electron 5 and reflected electron 6, selected is the one having a smaller fluctuation in electron energy and thereby yielding less chromatic aberration. Since the number of reflected electrons 6 is smaller than the number of secondary electrons 5, however, the aperture stop 13 is moved so as to select an aperture 13a having a larger diameter, so as to increase the electrons to be detected, thereby enhancing S/N.

When measurement throughput has priority, the secondary electrons 5, whose number is greater than that of the reflected electrons 6, are to be detected. Here, since aberrations caused by fluctuations in electronic energy are not negligible in the secondary electrons 5, the aperture stop 13 is moved so as to select an aperture 13b having a smaller diameter, thereby suppressing chromatic aberration.

Thus, the lens voltages of the respective lenses 9, . . . are set to predetermined values, while the apertures 13a and 13b having different diameters in the aperture stop 13 are appropriately selected, thereby allowing the single detector 8 to obtain images with the same order of S/N by either the secondary electrons 5 or reflected electrons 6. Accordingly, for example, the secondary electrons 5 with a better S/N may be used for measuring lens conditions and the individual columns 1 and 7, and then the reflected electrons 6 may be used for obtaining a high-resolution image.

Thus, when the Wien filter 25 is used, the irradiating 5 direction of the primary irradiation beam 2 and the reflecting direction of the reflected electrons 6 can be set perpendicular to the sample 4. As a consequence, no shadow occurs in the reflected image, whereby a high-quality image can be obtained.

Also, according to the setting of the Wien filter 25, electrons to be lead toward the second lens 10 can be selected. Consequently, the secondary electrons 5 or reflected electrons 6 that have not been selected are prevented from being lead toward the second lens 10, whereby the image from the detector 8 can attain a higher quality as well.

Upon starting up the apparatus of the first embodiment or the like, due to errors in manufacture (electric errors and mechanical errors), the respective lens voltages of the individual lenses 9, . . . often fail to be optimized even when they are set in conformity to their designed values. Therefore, deviations from the optimal values are computed, and a correction value inherent in this apparatus is calculated, from which the lenses are set to appropriate lens voltages.

Namely, while the field hole 14a or 14b in the field aperture 14 at the imaging position is selected upon normal operation, the mesh portion 14c or 14d is selected by a movable mechanism upon starting up the apparatus. The patterns of the mesh portions 14c and 14d are known and are designed with appropriate forms, sizes, and intervals.

Accordingly, when the lens voltages of the lenses 11 and 12 behind the field aperture 14 are set to their designed values, deviations from the originally designed values in terms of magnification and aberration are computed by the CPU 20 from data of images of the mesh portions 14c and 14d detected by the detector 8, so as to determine a correction value. Then, according to this value, the secondary optical system control unit 22 is controlled so as to set lens voltages of the third and fourth lenses 11 and 12 to their appropriate values.

Subsequently, the lens conditions of the lenses 9 and 10 in front of the field aperture 14 are detected. Namely, the stage 3 is moved so that the fiducial mark 3a is irradiated with the primary irradiation beam 2, while the field aperture 14 is moved so as to selectively use the field hole 14a or 14b.

Then, a mesh-like pattern image of the fiducial mark 3a is formed on the detector 8. This image and an optimal image are compared with each other by the CPU 20, whereby amounts of deviation concerning the lens voltages of the cathode lens 9 and second lens 10 in front of the field aperture 14 are computed. Here, since the lens conditions (aberration and magnification) of the third and fourth lenses 11 and 12 behind the field aperture 14 are known, the lens conditions (aberration, magnification, and resolution) of the second lens 10 and cathode lens 9 in front of the field aperture 14 can be determined, thus allowing optimal setting to be effected easily. According to an instruction from the CPU 20, these data are stored into a memory.

Though the correction value may fluctuate upon changes in external factors due to relocation of such an object observing apparatus and the like, when a maintenance mode is set so as to compare the image data stored upon starting up according to the above-mentioned method with image data of the lens voltages at that time, amounts of deviation can be detected easily, thereby allowing to check whether the optimal values are attained or not. When there is a deviation, the correction data may be updated before use, if necessary.

Further, in the case where several kinds of mesh sizes are provided for the mesh portions 14c and 14d in the field aperture 14, the mesh form of the fiducial mark 3a, and the like, they can be selectively used from a low magnification to a high magnification. Also, correction can be easily effected without necessitating complicated operations such as breaking of vacuum in the apparatus.

Since aberration at a given voltage can be computed from image data, even when aberration occurs more than its desired amount, as long as it is within a correctable range, the amount of aberration can be fed back to the CPU 20, whereby aberration can be apparently canceled.

In the following, operations of the object observing apparatus thus set to optimal lens voltages will be explained.

As the sample 4 is irradiated with the primary irradiation beam 2 from the primary column 1, the secondary electrons 5 including two-dimensional information and having a different energy are generated from the surface of the sample 4.

Since the directivity of the secondary electrons 5 is low, whereas the lowermost electrode (cathode portion) of the cathode lens 9 forms a positive electric field, the secondary electrons 5 are lead into the cathode lens 9 as being attracted to this electrode. These secondary electrons 5 form images several times in the middle of the individual lenses 9, . . . , and their image is enlarged to a predetermined magnification so as to be finally projected onto the detector 8 as being magnified.

Here, on the rear side of the second lens 10, the aperture stop 13 suppresses various kinds of aberration in the lenses 11 and 12, while determining the angle of divergence of electrons at the sample surface.

On the other hand, at the intermediate imaging point 14P (position optically conjugate with the sample), the field aperture 14 corresponding to the field stop is inserted in front of the third lens 11 here, whereby only the electron beam in the required field of view is led to the later stage of lens system (third and fourth lenses 11 and 12) and the detector 8. In this case, since the field aperture 14 is formed with the field holes 14a and 14b having sizes different from each other, these field holes 14a and 14b are appropriately set according to the image size and the like.

Then, a sample image signal of the detector 8 is taken out by the control unit 17, and this signal is further sent from the control unit 17 to the CPU 20, whereby the image is read out.

Concurrently, the stage 3 is moved in XY directions by the stage moving mechanism 18, whereas the position of the stage 3 is read out by the laser interferometer unit 19. According to an instruction from the CPU 20, the stage moving mechanism 18 is driven, and its positional information is transmitted from the laser interferometer unit 19 to the control unit 17, whereby sample images are successively supplied to the CPU 20.

Here, how to select the secondary electron 5 or reflected electron 6 in practice will be explained. The S/N of the resulting image is in proportion to the number of electrons at the surface of the detector 8, and chromatic aberration, which is heavily influential in the image, depends on fluctuations in electronic energy. Accordingly, when priority is to be assigned to the resolution of image in measurement, the aperture 13a with the smaller diameter is used for reducing chromatic aberration. In the case where the number of signal electrons in the reflected electrons 6 or secondary electrons 5 is small, however, the aperture stop 13 is moved to select the aperture 13b with the larger diameter, so as to increase the number of electrons to be detected, thus allowing S/N to improve.

On the other hand, when priority is to be given to measurement throughput, the secondary electrons 5 whose number is greater than that of the reflected electrons 6 are to be detected. Since the aberration caused by deviations in electron energy is not negligible in the secondary electrons 5, however, the aperture stop 13 is moved so as to select the aperture with the smaller diameter, so as to suppress chromatic aberration.

Thus, the lens voltages of the respective lenses 9, . . . are set to predetermined values, while the apertures 13a and 13b having diameters different from each other in the aperture stop 13 are appropriately selected therebetween, thereby allowing the single detector 8 to obtain images with the same order of S/N by using either the secondary electrons 5 or reflected electrons 6. Accordingly, for example, the secondary electrons 5 with a better S/N may be used for measuring lens conditions and the individual columns 1 and 7, and then, when the reflected electrons 6 yield less chromatic aberration, they may be used for obtaining a high-resolution image.

FIG. 3 shows the second embodiment in accordance with the present invention. In the second embodiment, without using the Wien filter, the primary irradiation is effected with an angle of inclination of 1 with respect to a sample, and the reflected electrons, secondary electrons, or the like reflected by the sample with an angle of 2 are lead to the secondary optical system. In the other part of configuration, constituents referred to with numerals identical to those in FIG. 1A are identical thereto in their functions and structures and thus will not be explained here.

Figure 4:
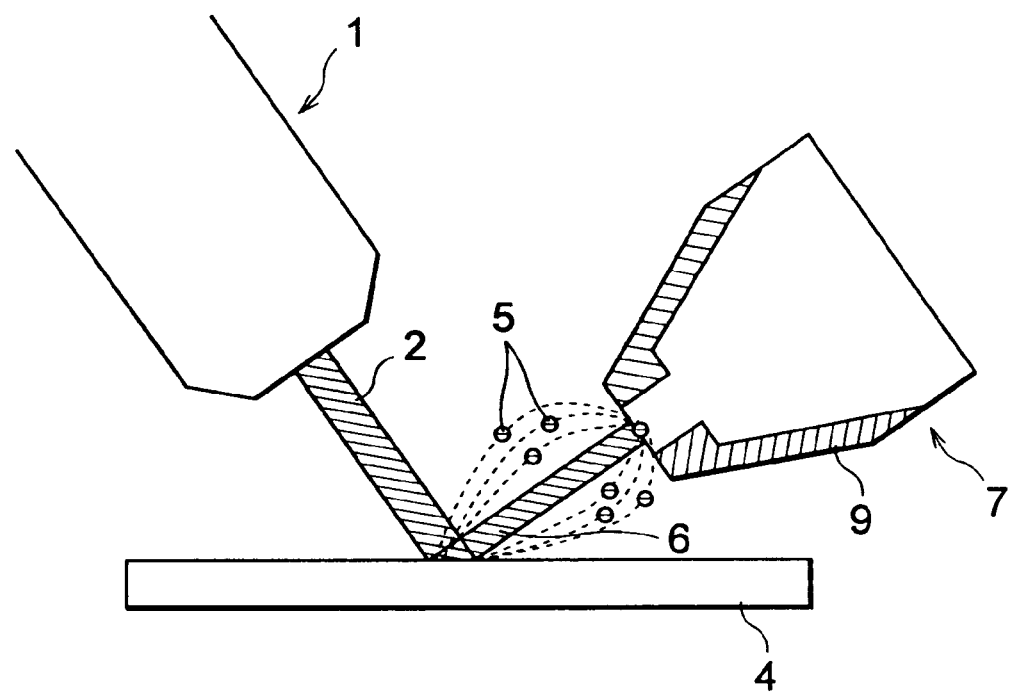
FIG. 4 is a schematic view showing the primary irradiation beam, secondary electrons, reflected electrons, and the like in the second embodiment.

FIG. 4 is a view explaining states of emission and incidence of the primary irradiation beam, secondary electrons, reflected electrons, and the like in the second embodiment. As shown in this drawing, when the sample is irradiated with the primary irradiation beam 2 from the primary column 1, the secondary electrons 5 and reflected electrons 6 including two-dimensional image information and having different energies are generated from the surface of the sample 4.

Since the reflected electrons 6 are generated when the primary irradiation beam 2 irradiating the sample 4 is reflected by the latter, they are reflected by the angle of reflection 2 identical to the angle of incidence 1 of the primary irradiation beam 2 with respect to the sample 4. As the secondary column 7 is oriented to the direction along which the reflected electrons 6 are made incident thereon, the reflected electrons 6 are lead to the column 7.

On the other hand, since the directivity of the secondary electrons 5 is low, whereas the lowermost electrode (cathode portion) of the cathode lens 9 forms a positive electric field, the secondary electrons 5 are lead into the cathode lens 9 as being attracted to this electrode.

Then, as with the first embodiment, the lens voltages of the individual lenses 9, . . . are controlled to given values, whereby the secondary electrons 5 or reflected electrons 6 having a different energy are selected. These electrons 5 or 6 form images several times in the middle of the individual lenses 9, . . . , and their image is enlarged to a predetermined magnification so as to be finally projected onto the detector 8 as being magnified. As a consequence, when the electrons with a higher yield (secondary electrons 5 or reflected electrons 6) are selected according to the state of sample 4, the detection in conformity to the state of sample 4 can be effected.

Figure 5:
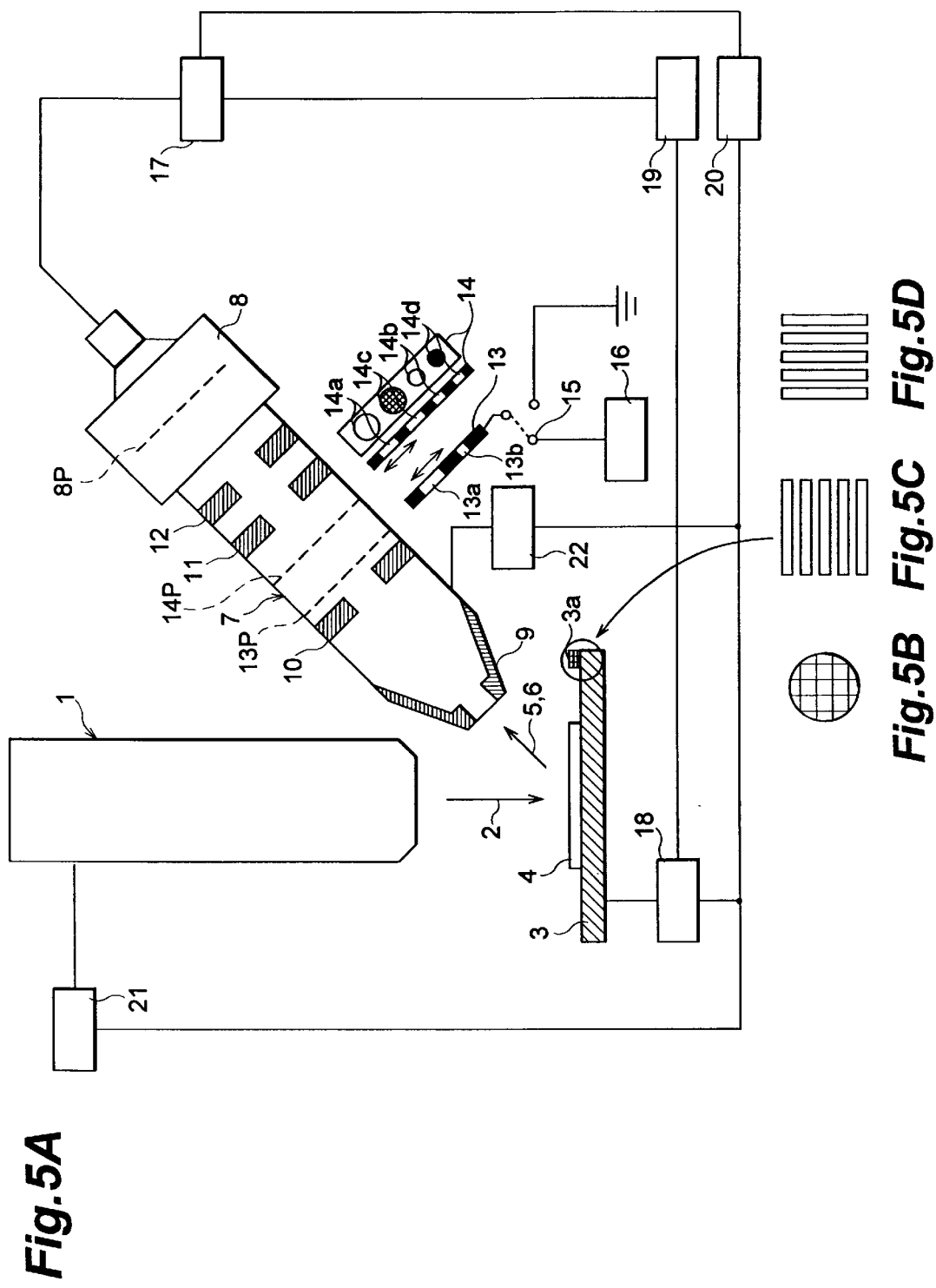
FIGS. 5A to 5D are schematic views of the object observing apparatus in accordance with the third embodiment of the present invention.

FIGS. 5A to 5D are views showing schematic configurations of the third embodiment in accordance with the present invention. The third embodiment differs from the first embodiment in that no Wien filter is used, and differs from the second embodiment in that the direction of the primary irradiation is perpendicular to the sample and that the direction of capturing the secondary electrons and the like is inclined with respect to the sample as shown in FIG. 5A. In the other part of configuration, constituents referred to with numerals identical to those in FIG. 1A are identical thereto in their functions and structures and thus will not be explained here. Also, the principal of action, adjusting method, and the like of this embodiment are substantially the same as those explained with reference to FIG. 1A and thus will not be explained here.

Though at least one of the primary optical system and secondary optical system is of stationary type in each of the second and third embodiments, one or both of them may be made movable so as to be moved when reflected electrons are made incident on the secondary optical system, such that the secondary optical system follows the angle of reflection of the reflected electrons.

Figure 6:
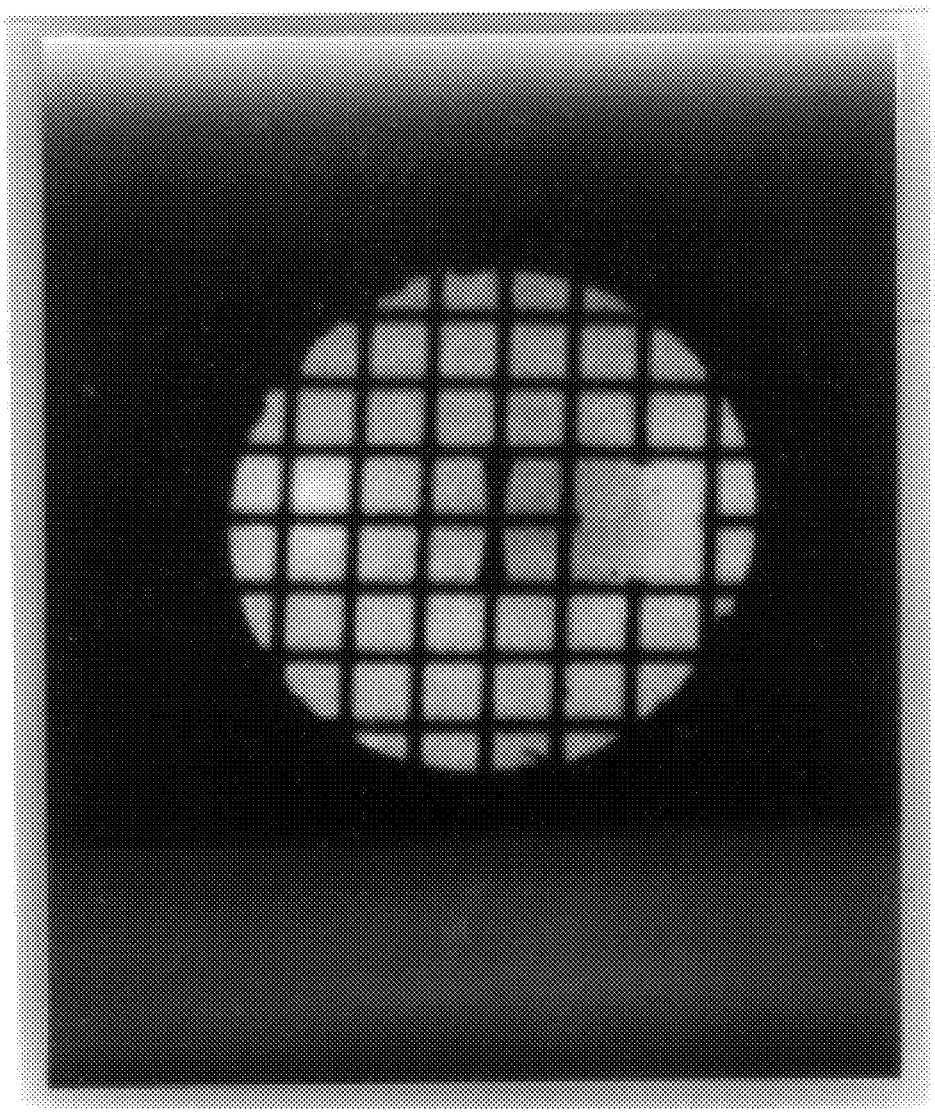
FIG. 6 is a photograph of an observation image obtained by an example in accordance with the present invention.

FIG. 6 is a photograph taken by a detector in an apparatus in which a primary optical system is disposed obliquely with respect to a sample so that a primary irradiation beam obliquely irradiates the sample, while a mesh-like object made of Cu is disposed at a position conjugate with the sample in a secondary optical system disposed perpendicular to the sample. Here, the photograph-taking condition is:
Acceleration voltage of the primary optical system: 2.0 kV
Retarding voltage: 1.2 kV $V_{c1}$ (9): 800 V $V_{TL}$ (10): 800 V $V_{PL1}$ (11): 1,000 V $V_{PL2}$ (12): 0 V As explained in the foregoing, the present invention can detect various kinds of samples through a single detection system by choosing electrons (secondary electrons or reflected electrons) having a higher yield according to the state of sample.

In the case where an aperture stop is formed with apertures having sizes different from each other and they are appropriately selected, for example, an image with a higher resolution can be obtained when reflected electrons are chosen as electrons to be detected and an aperture having a size appropriate therefor is selected, whereas an image with a higher S/N can be obtained when secondary electrons are chosen as electrons to be detected and an aperture having a size appropriate therefor is selected.

Further, in the case where a primary irradiation beam emitted from an electron gun is caused to irradiate the sample by way of a Wien filter and a cathode portion, the primary irradiation beam can be decelerated by the cathode portion before irradiating the sample. When the irradiating direction of the primary irradiation beam onto the sample and the direction of electrons generated from the sample are made perpendicular to the sample, it can yield a practically advantageous effect in that no shadow occurs in the reflected image.

Since lens conditions can be determined efficiently, startup setting for the apparatus can be effected rapidly by use of this method or apparatus. This is quite effective when taking account of the fact that the apparatus is operated in a vacuum. Also, as the lens condition of each lens at a given voltage has been detected, when the lens condition is investigated upon starting up the apparatus and so forth, abnormalities of the apparatus can be detected from fluctuations in lens voltage.

In the case where a field aperture is formed with a field hole and a first pattern such as those shown in FIGS. 1B to 1D, and the field aperture is moved so as to allow the field hole and the first pattern to be selectively used, simply switching them enables either lens condition inspection or sample inspection to be performed easily.

When the field aperture is formed with field holes having sizes different from each other, a field hole with an appropriate size can be selected according to the image size and the like.

Further, in the case where a primary irradiation beam emitted from an electron gun is caused to irradiate the sample by way of a Wien filter and a cathode portion, the primary irradiation beam can be decelerated by the cathode portion before irradiating the sample. Also, as the irradiating direction of the primary irradiation beam onto the sample and the direction of electrons generated from the sample can be made perpendicular to the sample, it exhibits a practically advantageous effect in that the reflected image forms no shadow.

What is claimed is:

1. An object observing apparatus comprising:

a stage arranged to mount a sample to be observed;

a primary optical system, having an electron gun, for emitting a primary irradiation beam to said stage; and a secondary optical system, having an inlet facing said stage, for receiving an electron generated when said sample is irradiated with said primary irradiation beam and forming an image thereof, said secondary optical system comprising an imaging optical system for forming an image of the electron incident thereon, and a field aperture having a plurality of optical patterns and being adapted to selectively attach and detach each optical pattern at a position optically conjugate with said sample.

2. An object observing apparatus according to claim 1, wherein said optical patterns are field holes having sizes different from each other.

3. An object observing apparatus according to claim 1, further comprising a Wien filter disposed in said secondary optical system, wherein said primary optical system and said secondary optical system are connected to each other, said primary irradiation beam emitted from said electron gun perpendicularly irradiating said sample on said stage by way of said Wien filter, said inlet of said second optical system being disposed perpendicular to said stage.

4. A method of adjusting a lens system of the object observing apparatus according to claim 1, said lens system adjusting method comprising the steps of:

mounting a sample on said stage;

irradiating said sample with a primary irradiation beam emitted from said primary optical system;

inserting a field aperture with a first pattern at a position optically conjugate with said sample within said secondary optical system; and inspecting an imaging state of an image of said first pattern in a given state of a lens within said secondary optical system and detecting a state of a lens disposed optically behind said conjugate position.

5. A lens system adjusting method according to claim 4, further comprising a step of comparing a value detected at said detecting step and a desired design value with each other so as to compute a deviation in magnification or aberration and determine a correction value, and setting a lens voltage of a lens behind said first pattern according to said correction value.

6. A lens system adjusting method according to claim 5, further comprising the steps of:

setting, according to said correction value, a voltage to be applied to the lens disposed optically behind said conjugate position;

subsequently forming an image of a second pattern disposed at said stage for mounting said sample, detecting a lens condition of a lens between said first pattern and said stage from said second pattern image, and outputting a detected value; and comparing said detected value and a desired design value with each other so as to compute a deviation in magnification or aberration and determine a correction value, and adjusting a voltage to be applied to a lens positioned between said conjugate position and said stage.

7. An object observing apparatus comprising:

a stage arranged to mount a sample to be observed;

a primary optical system, having an electron gun, for emitting a primary irradiation beam to said stage; and a secondary optical system, having an inlet facing said stage, for receiving an electron generated when said sample is irradiated with said primary irradiation beam and forming an image thereof, wherein said secondary optical system comprises an imaging optical system for forming an image of the electron incident thereon, and an aperture stop having a plurality of optical patterns and being adapted to selectively attach and detach each optical pattern at a position near a pupil position of the whole optical system.

8. An object observing apparatus according to claim 7, wherein said optical patterns have apertures with sizes different from each other.

9. An object observing apparatus according to claim 7, further comprising a Wien filter disposed in said secondary optical system, wherein said primary optical system and said secondary optical system are connected to each other, said primary irradiation beam emitted from said electron gun perpendicularly irradiating said sample on said stage by way of said Wien filter, said inlet of said second optical system being disposed perpendicular to said stage.

* * * * *